United States Patent
Yamashita

(10) Patent No.: US 9,698,189 B2
(45) Date of Patent: Jul. 4, 2017

(54) PHOTOELECTRIC CONVERTER AND PHOTOELECTRIC CONVERSION SYSTEM

(71) Applicant: CANON KABUSHIKI KAISHA, Tokyo (JP)

(72) Inventor: Takanori Yamashita, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 14/846,332

(22) Filed: Sep. 4, 2015

(65) Prior Publication Data
US 2016/0071986 A1  Mar. 10, 2016

(30) Foreign Application Priority Data
Sep. 9, 2014 (JP) ................. 2014-183698

(51) Int. Cl.
*H04N 5/335* (2011.01)
*H01L 27/146* (2006.01)

(52) U.S. Cl.
CPC .. *H01L 27/14643* (2013.01); *H01L 27/14632* (2013.01); *H01L 27/14687* (2013.01); *H01L 27/14689* (2013.01); *H01L 27/14636* (2013.01)

(58) Field of Classification Search
CPC ................................. H01L 27/14632
See application file for complete search history.

(56) References Cited

FOREIGN PATENT DOCUMENTS

| JP | 2007-059516 A | 3/2007 |
| JP | 2011-29337 A | 2/2011 |
| JP | 2012-124343 A | 6/2012 |

*Primary Examiner* — Gary C Vieaux
(74) *Attorney, Agent, or Firm* — Canon USA, Inc. I.P. Division

(57) ABSTRACT

The disclosure provides at least a photoelectric converter, and at least a photoelectric conversion system, including a plurality of pixels each having a photoelectric conversion layer and a pixel electrode; a first electrode that supplies a potential to each of the photoelectric conversion layers of a plurality of pixels in common, and a second electrode that supplies the potential to the first electrode. The pixel electrode is formed by metal and further includes an oxide conductive film disposed between the first electrode and the second electrode.

8 Claims, 5 Drawing Sheets

PHOTOELECTRIC CONVERTER AND PHOTOELECTRIC CONVERSION SYSTEM

BACKGROUND OF THE INVENTION

Field of the Invention

The present disclosure relates to a photoelectric converter, a photoelectric conversion system and a method for manufacturing a photoelectric converter.

Description of the Related Art

Japanese Patent Laid-Open No. 2012-124343 discloses a photoelectric converter including a photoelectric conversion layer formed above a semiconductor substrate. In the disclosed photoelectric converter, a common electrode common to a plurality of pixels is provided above the photoelectric conversion layer. In the disclosed photoelectric converter, a connecting electrode provided outside a pixel region is connected electrically to the common electrode.

In the disclosed photoelectric converter, an insulating natural oxide film may be formed on a surface of the connecting electrode during the production of the photoelectric converter. The oxide film may lower electrical conductivity between the connecting electrode and the common electrode.

SUMMARY OF THE INVENTION

The present disclosure provides at least one photoelectric converter, comprising: a plurality of pixels each having a photoelectric conversion layer and a pixel electrode configured to supply a potential to the photoelectric conversion layer thereof; a first electrode configured to supply a potential to each of the photoelectric conversion layers of the plurality of pixels in common, and the first electrode having a region opposite to the pixel electrode via the photoelectric conversion layer of each pixel; and a second electrode configured to supply the potential to the first electrode, wherein the pixel electrode of each pixel is formed by metal, and further includes an oxide conductive film provided between the first electrode and the second electrode, and the oxide conductive film contacts the first electrode and the second electrode.

According to other aspects of the present disclosure, one or more additional photoelectric converters, one or more photoelectric conversion systems and one or more methods of manufacturing a photoelectric converter are discussed herein. Further features of the present disclosure will become apparent from the following description of exemplary embodiments with reference to the attached drawings.

DESCRIPTION OF THE EMBODIMENTS

Hereinafter, a photoelectric converter of each embodiment is described with reference to the drawings.

First Embodiment

Figure 1A:
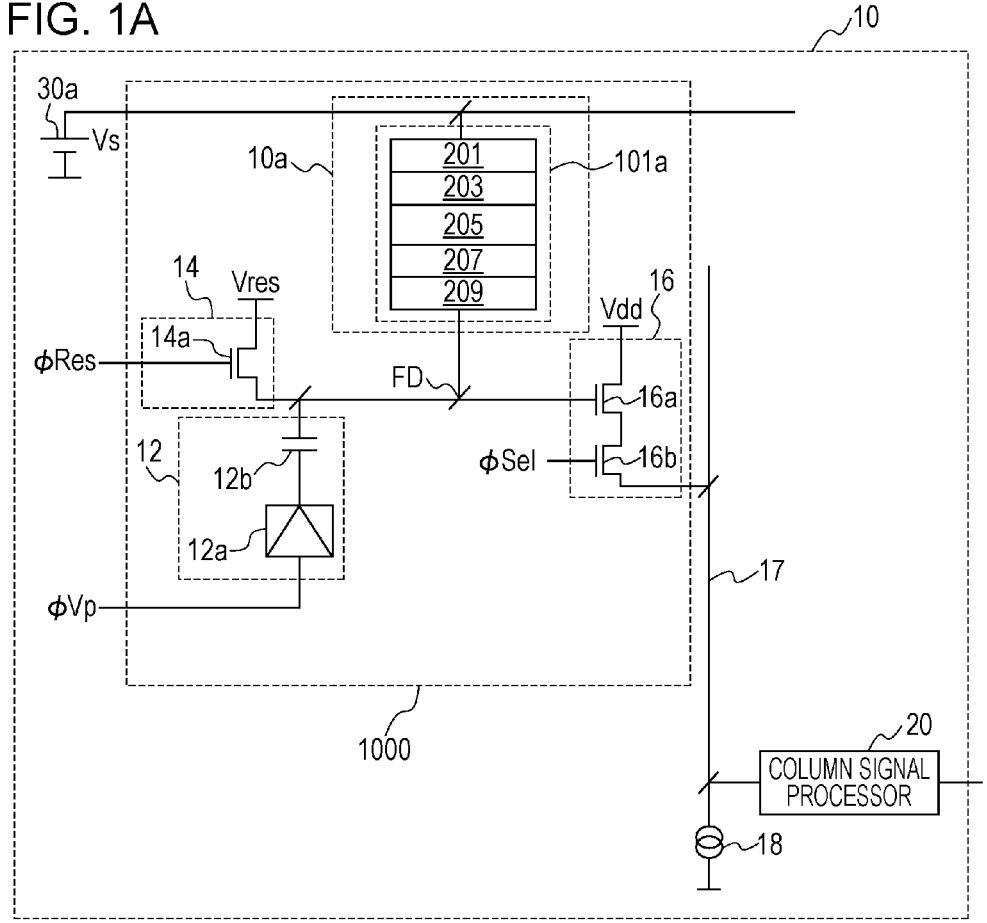
FIGS. 1A and 1B illustrate an exemplary configuration of a photoelectric converter.
Figure 1B:
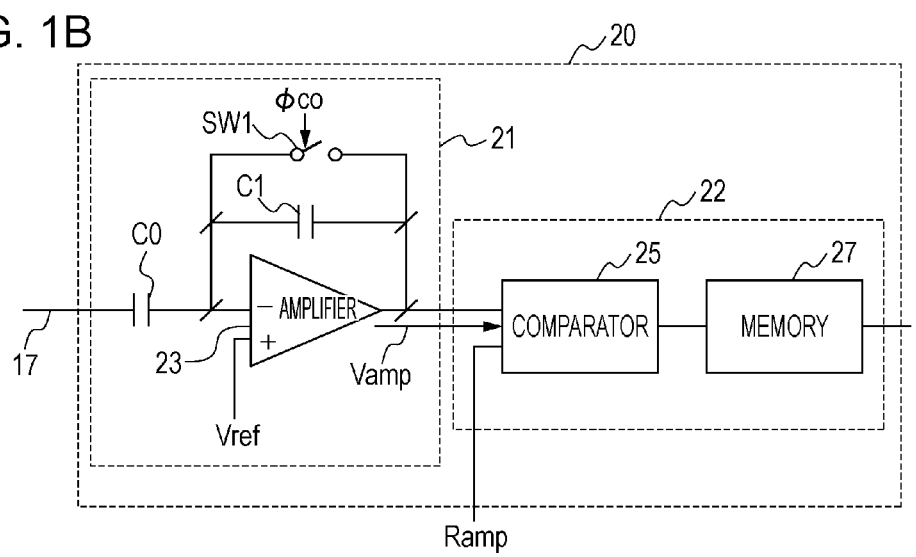

FIGS. 1A and 1B illustrate an exemplary configuration of a photoelectric converter of the present embodiment.

A photoelectric converter 10 illustrated in FIG. 1A includes a pixel 1000, a capacitance driving unit 12, a vertical signal line 17, a current source 18, and a column signal processor 20. The photoelectric converter 10 includes a power supply unit 30a.

The pixel 1000 includes a reset unit 14 and a pixel output unit 16.

A single pixel 1000 is illustrated in FIG. 1A, which is one of a plurality of pixels 1000 arranged in a plurality of rows and columns. FIG. 1A illustrates a single vertical signal line 17, a single current source 18, and a single column signal processor 20. These are one of a plurality of columns of vertical signal lines 17, current sources 18, and column signal processors 20 provided corresponding to each column in which a plurality of pixels 1000 are arranged.

A photoelectric conversion unit 101a include a common electrode 201, a blocking layer 203, a photoelectric conversion layer 205, an insulating layer 207, and a pixel electrode 209. The common electrode 201 is electrically connected to a plurality of photoelectric conversion units 101a in common. The common electrode 201 supplies a potential to a plurality of photoelectric conversion units 101a in common.

The blocking layer 203 is provided between the common electrode 201 and the photoelectric conversion layer 205. The photoelectric conversion layer 205 is provided between the blocking layer 203 and the insulating layer 207. The insulating layer 207 is provided between the photoelectric conversion layer 205 and the pixel electrode 209.

The common electrode 201 is formed by a conductive member with high transmittance of light of a wavelength region in which the photoelectric conversion layer 205 has sensitivity. For example, a compound including indium, such as indium tin oxide (ITO), and/or tin, and a compound, such as ZnO, are used as a material of the common electrode 201. Therefore, the photoelectric conversion layer 205 of the present embodiment may take in a greater amount of light than in a configuration in which an opaque electrode, such as copper, is used as the common electrode 201. Alternatively, the common electrode 201 of the present embodiment may be formed by polysilicon or metal of which thinness allows a certain amount of light to pass through.

The blocking layer 203 reduces injection of charge of the same conductivity type as that of signal charge accumulated by the photoelectric conversion layer 205 in the photoelectric conversion layer 205 from the common electrode 201. The photoelectric conversion layer 205 is depleted due to a potential difference between a potential Vs applied to the common electrode 201 and a potential of the pixel electrode 209. An inclination of the potential of the photoelectric conversion layer 205 is reversed depending on a relationship between the potential Vs applied to the common electrode 201 and the potential of the pixel electrode 209. With this configuration, the photoelectric conversion layer 205 may accumulate signal charge and discharge the accumulated signal charge. An operation of the photoelectric conversion unit 101a is described later.

In the present embodiment, a power supply voltage supplied to the common electrode 201 is a potential Vs supplied from the power supply unit 30a.

The photoelectric conversion layer 205 is formed by, for example, intrinsic amorphous silicon (hereafter, a-Si), low-concentration P-type a-Si, and low-concentration N-type a-Si. The photoelectric conversion layer 205 may be formed by a compound semiconductor. Examples of the compound semiconductor may include III-V compound semiconductors, such as BN, GaAs, GaP, AlSb, and GaAlAsP, II-VI compound semiconductors, such as CdSe, ZnS, and HdTe, and IV-VI compound semiconductors, such as PbS, PbTe, and CuO. The photoelectric conversion layer 205 may be formed by an organic material. For example, fullerene, coumarin 6 (C6), Rhodamine 6G (R6G), zinc phthalocyanine (ZnPc), quinacridone, a phthalocyanine-based compound, and a naphthalocyanine-based compound may be used. The photoelectric conversion layer 205 may use a quantum dot film including above-described compound semiconductor.

If the photoelectric conversion layer 205 is formed by a semiconductor, impurity concentration of the semiconductors is desirably low, or the semiconductors are desirably intrinsic.
With this configuration, a depletion layer may be expanded sufficiently in the photoelectric conversion layer 205, which provides effects, such as increased sensitivity and reduced noise.

The blocking layer 203 is formed by the same material as that of the semiconductors used for the photoelectric conversion layer 205, and the N-type or P-type semiconductors with higher impurity concentration than that of the semiconductors used in the photoelectric conversion layer 205. For example, if a-Si is used in the photoelectric conversion layer 205, N-type a-Si with impurities doped in the blocking layer 203, or P-type a-Si with impurities doped are used. Since the Fermi level varies depending on the impurity concentration, the blocking layer 203 functions as a potential barrier for either one of the electron or hole. If the photoelectric conversion layer 205 includes a quantum dot film, a blocking layer 203 formed by the same material as that of the semiconductor used in the quantum dot film and of a conductivity type opposite to the conductivity type of the quantum dot film may be provided. For example, if the quantum dot film is P-type PbS, the blocking layer 203 may be N-type PbS. If the blocking layer 203 is formed by the same material and of the same conductivity type as that of the quantum dot film, the quantum dot film and the blocking layer 203 may be different in impurity concentration.

Alternatively, the blocking layer 203 may be formed by a material different from that of the photoelectric conversion layer 205. In this configuration, a hetero-junction is formed. Since a band gap varies depending on the material, a potential barrier may be formed in either of the electron or the hole. If the photoelectric conversion layer 205 includes a quantum dot film, for example, PbS may be used as the quantum dot film, and ZnO may be used as the blocking layer 203.

The insulating layer 207 is disposed between the photoelectric conversion layer 205 and the pixel electrode 209. The insulating layer 207 may be formed by, for example, amorphous silicon oxide (hereafter, a-SiO), amorphous silicon nitride (a-SiN), and an organic material. The thickness of the insulating layer 207 may be defined so that the signal charge does not pass through the insulating layer 207 by the tunnel effect. This configuration may reduce current leakage, and thereby reduce noise. Specifically, the thickness of the insulating layer 207 is desirably 50 nm or more.

If an amorphous film is used for the blocking layer 203, the photoelectric conversion layer 205, and the insulating layer 207, a hydrogen treatment may be performed to terminate the dangling bond with hydrogen. With this configuration, noise may be reduced.

The pixel electrode 209 is formed by a conductive member, such as metal. The pixel electrode 209 is formed by a conductive member constituting wiring, or the same conductive member constituting a pad electrode for connecting to the outside. The thus configured photoelectric conversion unit 101a of the present embodiment may form the pixel electrode 209 and the conductive member constituting wiring or the pad electrode at the same time. Therefore, the photoelectric conversion unit 101a of the present embodiment may be produced in a more simplified process than in a case in which the pixel electrode 209 is formed by a material different from the conductive member constituting wiring, or the pad electrode. Since the pixel electrode 209 is formed by metal, the pixel electrode 209 may cause the light passed through the photoelectric conversion layer 205 and reached the pixel electrode 209 to be reflected on the photoelectric conversion layer 205. Thus, light quantity received by the photoelectric conversion layer 205 becomes greater than in a case in which the pixel electrode 209 is formed by other materials than metal, such as an oxide conductive film. Therefore, sensitivity of photoelectric conversion unit 101a is increased.

The common electrode 201 of the photoelectric conversion unit 101a is electrically connected to the power supply unit 30a. The power supply unit 30a supplies the potential Vs to the common electrode 201.

The reset unit 14 includes a reset transistor 14a. In the reset transistor 14a, a reset potential Vres is supplied to one of a source and a drain, and the other of the source and the drain is electrically connected to a node FD. The reset potential Vres is a potential lower than the potential Vs. In the present embodiment, the potential Vs is set to 5V and the reset potential Vres is set to 2V. A signal φRES is input in a gate of the reset transistor 14a from an unillustrated vertical scanning circuit.

The capacitance driving unit 12 includes a buffer circuit 12a and a capacitive element 12b. A first node, which is one of the nodes of the capacitive element 12b, is electrically connected to the node FD, which is a third node. Moreover, the first node of the capacitive element 12b is electrically connected to the pixel electrode 209 of the photoelectric conversion unit 101a. A second node, which is the other node of the capacitive element 12b, is electrically connected to the buffer circuit 12a. In the buffer circuit 12a, a signal φVp is input from an unillustrated timing generator. The buffer circuit 12a supplies, to the capacitive element 12b, a potential that is a buffered potential of the signal φVp. The timing generator is a capacitance potential supply unit that supplies the signals φVp of different potentials to the capacitive element 12b via the buffer circuit 12a.

The capacitive element 12b is electrically connected to the node FD. The capacitive element 12b includes, for example, mutually facing two electrodes. The two electrodes are formed by, for example, polysilicon and metal. Alternatively, the capacitive element 12b includes a semiconductor region, and a gate electrode disposed above the semiconductor region.

In the configuration in which the capacitive element 12b is connected to the node FD, noise may be reduced during the readout of optical signals from the photoelectric conversion unit 101a. This noise reduction effect is described.

In the photoelectric converter of the present embodiment, the potential of the node FD is controlled. The potential of the pixel electrode 209 of the photoelectric conversion unit 101a varies depending on the ratio between the capacitive element 12b, and synthetic capacity of gate capacity of an amplifying transistor 16a connected via the node FD and a capacitance value of the capacity component between the common electrode 201 and the pixel electrode 209 (hereafter, considered to be a capacitance value of the photoelectric conversion unit 101a). This is because the capacitive element 12b and the synthetic capacity may be regarded as two capacitance connected in series.

In the photoelectric converter of the present embodiment, the greater the capacitance value of the capacitive element 12b becomes, the greater the changing quantity of the potential of the pixel electrode 209 when the signal φVp is changed becomes.

In the present embodiment, the capacitive element 12b is electrically connected to the node FD. The node in which the potential of the signal φVp of the capacitive element 12b is input and the node FD are separated electrically.

In the photoelectric converter of the present embodiment, the greater the capacitance value of the node FD becomes, the greater the changing quantity of the potential of the pixel electrode 209 when the potential of the node FD is changed becomes.

In the present embodiment, the capacitive element 12b is electrically connected to the node FD. Therefore, when the potential of the pixel electrode 209 is controlled to read the optical signal from the photoelectric conversion unit 101a, a large potential difference may be applied to between the common electrode 201 and the pixel electrode 209. Therefore, since the photoelectric conversion layer 205 may be depleted easily in the photoelectric converter of the present embodiment, noise included in the optical signal may be reduced.

The pixel output unit 16 includes the amplifying transistor 16a and a selection transistor 16b. A gate, which is an input node of the amplifying transistor 16a, is electrically connected to the node FD. A potential Vdd is input in one of a source and a drain of the amplifying transistor 16a, and the other of the source and the drain is electrically connected to one of a source and a drain of the selection transistor 16b. The other of the source and the drain of the selection transistor 16b is electrically connected to the vertical signal line 17. A signal φSel is input in a gate of the selection transistor 16b from an unillustrated vertical scanning circuit. The amplifying transistor 16a, which is an amplifier unit, outputs a signal that is an amplified signal of the signal output from the pixel electrode 209. A node of the selection transistor 16b connected to the vertical signal line 17 is an output node of the amplifier unit.

The current source 18 is electrically connected to the selection transistor 16b via the vertical signal line 17. When the selection transistor 16b is turned on, a source follower circuit is configured by the amplifying transistor 16a and the current source 18.

The signal output to the vertical signal line 17 via the selection transistor 16b from the amplifying transistor 16a is input in the column signal processor 20. The column signal processor 20 outputs a signal based on the signal output to the vertical signal line 17 from the amplifying transistor 16a.

FIG. 1B illustrates a configuration of the column signal processor 20.

The column signal processor 20 includes a column amplifier unit 21 and an AD conversion unit 22. The column amplifier unit 21 includes a capacitive element C0, a capacitive element C1, a switch SW1, and an amplifier 23. An operation of the switch SW1 is controlled by a signal φC0 output from an unillustrated timing generator. A signal output to the vertical signal line 17 from the amplifying transistor 16a is input in an inverting input node of the amplifier 23 via the capacitive element C0. A reference voltage Vref is input in a non-inverting input node of the amplifier 23. A signal Vamp output from the amplifier 23 is an inverted and amplified signal of the signal input in the inverting input node of the amplifier 23. An amplification factor of the amplifier 23 is k of a negative value.

The AD conversion unit 22 includes a comparator 25 and memory 27. The signal Vamp is input in the comparator 25 from the amplifier 23.

The comparator 25 compares a potential of a ramp signal Ramp input from the outside of the column signal processor 20 and a potential of the signal Vamp. The ramp signal Ramp is a signal of which potential changes monotonously with time. The signal that the comparator 25 outputs to the memory 27 is the signal indicating a comparison result between the potential of the ramp signal Ramp and the potential of the signal Vamp. The memory 27 holds a signal indicating a calculation result of time from the timing at which the ramp signal Ramp starts the change of potential until the signal level of the comparison result signal has changed. The signal which the memory 27 holds is a digital signal based on the signal Vamp.

The digital signal that the memory 27 of each of a plurality of columns of column signal processors 20 holds is sequentially output outside of the photoelectric converter by an unillustrated horizontal scanning circuit for each column.

Next, an operation of the photoelectric conversion unit 101a in the present embodiment is described. FIGS. 2A to 2D each schematically illustrate an energy band in the photoelectric conversion unit 101a. FIGS. 2A to 2D each illustrate the common electrode 201, the blocking layer 203, the photoelectric conversion layer 205, the insulating layer 207, and the pixel electrode 209. A vertical axis in each of FIGS. 2A to 2D indicates a potential to electrons. The potential to electrons becomes higher at higher positions in FIGS. 2A to 2D. The potential becomes lower at lower positions in FIGS. 2A to 2D. Regarding the common electrode 201 and the pixel electrode 209, the Fermi level is illustrated. Regarding the blocking layer 203 and the photoelectric conversion layer 205, a band gap between an energy level of a conducting zone and an energy level of a valence band is illustrated.

As the operation of the photoelectric conversion unit 101a, the following steps (1) to (5) are performed repeatedly. (1) Resetting the input node of the amplifier unit, (2) Reading the noise signal, (3) Transmitting the signal charge from the photoelectric conversion unit, (4) Reading the optical signal, and (5) Accumulating the signal charge. Each step is described below.

Figure 2A:
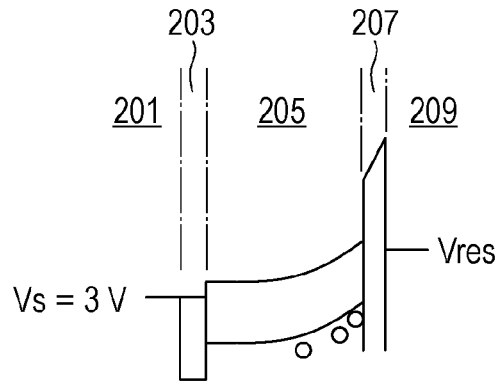
FIGS. 2A to 2D illustrate an exemplary operation of a photoelectric converter.

FIG. 2A illustrates a state of the photoelectric conversion unit 101a from step (1) to step (2). The potential Vs is supplied to the common electrode 201. A first potential Vs is, for example, 3V. Holes illustrated by white circles are accumulated in the photoelectric conversion layer 205 as the signal charge produced during an exposure period. A surface potential of the photoelectric conversion layer 205 on the side of the insulating layer 207 varies depending on the amount of the accumulated holes. The buffer circuit 12a supplies the first potential Vd1 to the capacitive element 12b. The first potential Vd1 is, for example, 0V.

The reset transistor 14a is turned on in this state. Thus, the node including the pixel electrode 209, i.e., the potential of the node FD, is reset to the reset potential Vres. The reset potential Vres is, for example, 1V. The node FD is connected to a gate which is the input node of the amplifying transistor 16a. Thus, the input node of the amplifier unit is reset.

Then, the reset transistor 14a is turned off, and the node FD becomes electrically floating. At this time, reset noise by the reset transistor 14a may occur. The holes of the signal charge are still accumulated in the photoelectric conversion layer 205.

When the selection transistor 16b is turned on, the amplifying transistor 16a outputs the noise signal including the reset noise.

Figure 2B:
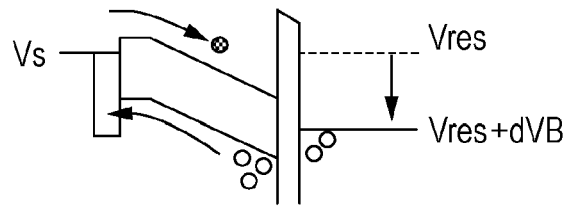
Figure 2C:
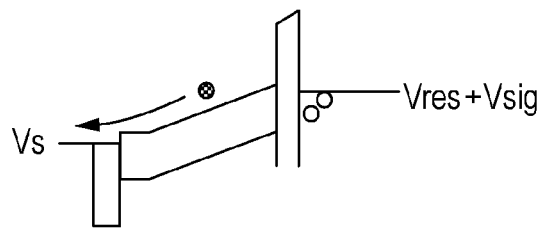

FIGS. 2B and 2C illustrate states of the photoelectric conversion unit 101a in step (3). First, the buffer circuit 12a supplies a second potential Vd2 to the capacitive element 12b. Since the holes are used as the signal charge, the second potential Vd2 is higher than the first potential Vd1. The second potential Vd2 is, for example, 5V.

At this time, the potential of the pixel electrode 209 (i.e., the node FD) changes toward the same direction as the change of the potential that the buffer circuit 12a supplies. A changing quantity dVB of the potential of the pixel electrode 209 is determined depending on the ratio between a capacitance value C1 of the capacitive element 12b electrically connected to the node FD, and a capacitance value C2 of the photoelectric conversion unit 101a. dVB is expressed as follows:

$$dVB=(Vd2-Vd1)\times C1/(C1+C2) \quad (1).$$

In the following description, for the ease of description, it is supposed that the capacitance value C1 and the capacitance value C2 are equal. Then, the changing quantity dVB is expressed as follows:

$$dVB=(Vd2-Vd1)\times(1/2) \quad (2).$$

In the present embodiment, the changing quantity dVB of the potential of the pixel electrode 209 is sufficiently larger than a difference between the potential Vs of the common electrode 201 and the reset potential Vres (Vs−Vres). Therefore, the potential of the pixel electrode 209 becomes lower than the potential of the common electrode 201, and an inclination of the potential of the photoelectric conversion layer 205 is inverted. Thus, electrons illustrated by black circles are injected into the photoelectric conversion layer 205 from the first electrode 201. A part or all of the holes accumulated in the photoelectric conversion layer 205 as the signal charge move toward the blocking layer 203. The moved holes are recombined with majority carriers of the blocking layer 203 and disappear. Then, the holes of the photoelectric conversion layer 205 are discharged from the photoelectric conversion layer 205. If the entire photoelectric conversion layer 205 is depleted, all the holes accumulated as the signal charge are discharged.

Next, in the state illustrated in FIG. 2C, the buffer circuit 12a supplies the first potential Vd1 to the capacitive element 12b. Then, the inclination of the potential of the photoelectric conversion layer 205 is inverted again. The electrons injected into the photoelectric conversion layer 205 in the state of FIG. 2B are discharged from the photoelectric conversion layer 205. Injection of the holes from the common electrode 201 into the photoelectric conversion layer 205 is reduced by the blocking layer 203. Therefore, the potential of the node FD changes from the reset state to a state by a potential Vsig in accordance with the amount of the holes disappeared. That is, the potential Vsig in accordance with the amount of the holes accumulated as the signal charge appears in the node FD. The potential Vsig in accordance with the amount of the accumulated holes is referred to as an optical signal component.

Here, the selection transistor 16b is turned on in the state illustrated in FIG. 2C. Then, the amplifying transistor 16a outputs the optical signal. A difference between the noise signal read in step (2) and the optical signal read in step (4) is the signal based on the potential Vsig in accordance with the accumulated signal charge.

Figure 2D:
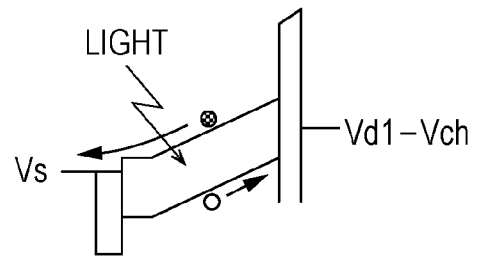

FIG. 2D illustrates the state of the photoelectric conversion unit 101a in step (5). The potential Vs is supplied to the common electrode 201, and the reset potential Vres is supplied to the node FD. Since the reset potential Vres is lower than the potential Vs of the common electrode 201, the electrons of the photoelectric conversion layer 205 are discharged to the common electrode 201. The holes of the photoelectric conversion layer 205 move toward an interface between the photoelectric conversion layer 205 and the insulating layer 207. However, since the holes cannot move to the insulating layer 207, the holes are accumulated in the photoelectric conversion layer 205. As described above, the blocking layer 203 reduces injection of the holes into the photoelectric conversion layer 205. Therefore, when light enters the photoelectric conversion layer 205 in this state, only the holes, among electronic hole pairs produced during the photoelectric conversion, are accumulated in the photoelectric conversion layer 205 as the signal charge. A potential Vch is a potential to which the pixel electrode 209 changes in accordance with the holes accumulated in the photoelectric conversion layer 205.

If the signal charge is electrons, the second potential Vd2 may be lower than the first potential Vd1. Further, the conductivity type of the blocking layer 203 may be opposite to that of the blocking layer 203 of the present embodiment. Therefore, the inclinations of the potential in FIGS. 2A to 2D are inverted. Other operations are the same.

Figure 3:
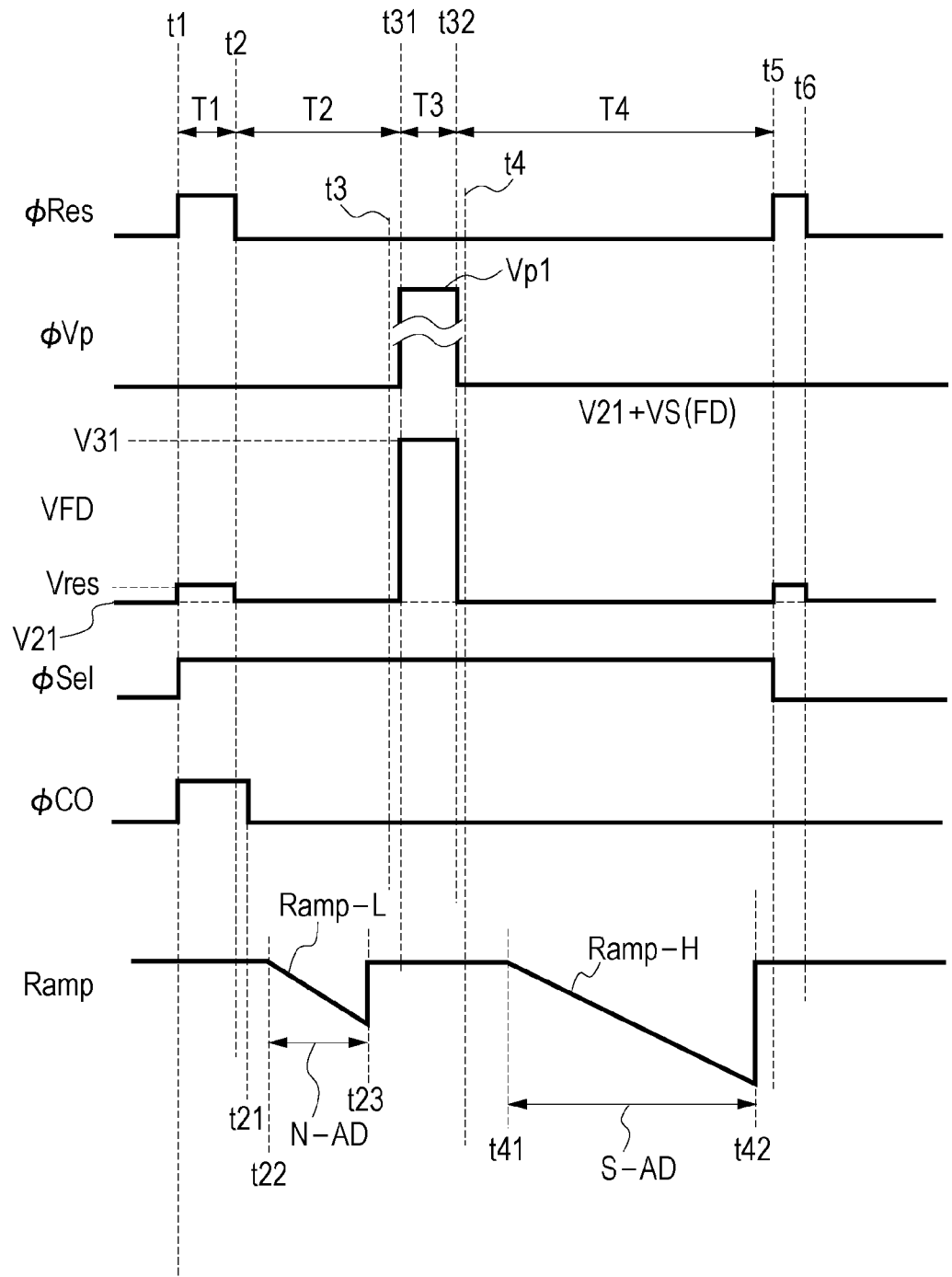
FIG. 3 illustrates an exemplary operation of a photoelectric converter.

FIG. 3 illustrates an operation of the photoelectric converter illustrated in FIG. 1A.

First, timing until the signal is read from the pixel 1000 to the vertical signal line 17 is described.

The reset transistor 14a and the selection transistor 16b illustrated in FIG. 1A are, in this order, turned on when the signal φRes and the signal φSel are at Hi levels (hereafter, "Hi"), and turned off when these signals are at Lo levels (hereafter, "Lo").

The period T1 is a reset period of the node FD, the period T2 is a period in which the node FD is in a floating state, the period T3 is a refreshment period of the photoelectric conversion unit 101a, and the period T4 is a signal charge holding period of the node FD. In the photoelectric converter of the present embodiment, the amplifying transistor 16a does not operate during the period from time t3 to time t4. The photoelectric conversion unit 101a starts a new photoelectric conversion event at the period T4 after the refreshment.

In FIG. 3, the potential of the node FD is denoted by VFD and the potential of the vertical signal line 17 is denoted by Vline.

Before time t1, the photoelectric conversion unit 101a is accumulating the signal charge.

At time t1, an unillustrated vertical scanning circuit switches the signal level of the signal φRes from Lo to Hi.

Then, the reset transistor 14a is turned on and the pixel electrode 209 and the node FD are reset to potential Vres.

At time t1, the vertical scanning circuit switches the signal ϕSel from Lo to Hi. Then, the selection switch 16 is turned on. Since a current is supplied to the amplifying transistor 16a from the current source 18, the amplifying transistor 16a becomes in an operating state.

At time t1, an unillustrated timing generator switches the signal level of the signal ϕC0 to Hi. Then, the charge of the capacitive element C1 is reset.

At time t2, the vertical scanning circuit switches the signal level of the signal ϕRes to Lo. Then, the node FD becomes floating. The floating potential V21 of the node FD at this time is referred to as a reset FD potential. The amplifying transistor 16a outputs a signal based on the reset FD potential to the vertical signal line 17. The operation during the period T1 from time t1 to time t2 is the operation corresponding to step (2) described above.

The timing generator switches the signal level of the signal ϕC0 to Lo at subsequent time t21. Then, the capacitive element C0 holds the signal output by the amplifying transistor 16a to the vertical signal line 17 and based on the reset FD potential.

The signal Vamp at time t22 mainly includes an offset component that the column amplifier unit 21 has. This signal is referred to as an offset signal.

The ramp signal Ramp changes the potential depending on time during the period from time t22 until time t23. The period from time t22 until time t23 is the period in which the AD conversion unit 22 converts the offset signal into the digital signal. This period is denoted by N-AD in FIG. 3. The digital signal based on the offset signal that the AD conversion unit 22 obtained is referred to as a digital N signal.

At time t31, an unillustrated timing generator switches the signal level of the signal ϕVp from Lo to the potential Vp1, which is the signal level of Hi. In the present embodiment, the potential Vp1 is 10V and the signal level of the signal ϕVp of Lo is 0V. The changing quantity dVB of the potential of the pixel electrode 209 is expressed by Expression (2): dVB=(10−0)×(1/2)=5(V). Therefore, the potential of the pixel electrode 209 is the reset potential Vres with 5V applied thereto.

When the signal ϕVp of the signal level Hi is input, as illustrated in FIG. 2B, the holes of the photoelectric conversion layer 205 are refreshed.

The timing generator switches the signal ϕVp to Lo at subsequent time t32. As illustrated in FIG. 2C, the optical signal is output to the pixel electrode 209. Then, the node FD has a potential based on the optical signal. This operation corresponds to the step (3) described above. FIG. 3 illustrates a case where light has not substantially entered the photoelectric conversion unit 101a. Although the potential of the node FD is illustrated as the reset FD potential, the potential of the node FD at time t32 is the potential based on the optical signal.

The amplifying transistor 16a outputs the signal based on the optical signal to the vertical signal line 17. This operation corresponds to step (4) described above. The signal Vamp of the column amplifier unit 21 has the potential of the signal that is an amplified signal based on the optical signal output from the amplifying transistor 16a (hereafter, "amplified optical signal).

Then, the ramp signal Ramp changes the potential depending on the time during the period from time t41 until time t42. The period from time t41 until time t42 is the period in which the AD conversion unit 22 converts the amplified optical signal into the digital signal. This period is denoted by S-AD in FIG. 3. The digital signal based on the amplified optical signal that the AD conversion unit 22 obtained is referred to as a digital S signal.

Therefore, the memory 27 of each column holds the digital N signal and the digital S signal. An unillustrated horizontal scanning circuit sequentially reads the digital N signal and the digital S signal from the memory 27 of each column, and outputs outside the photoelectric converter.

Figure 4:
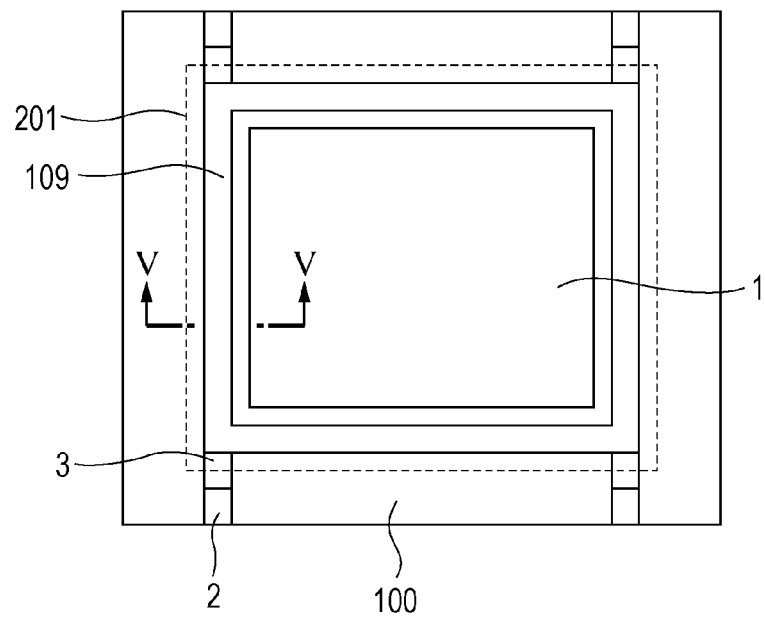
FIG. 4 is a bird's-eye view of an exemplary photoelectric converter.
Figure 5:
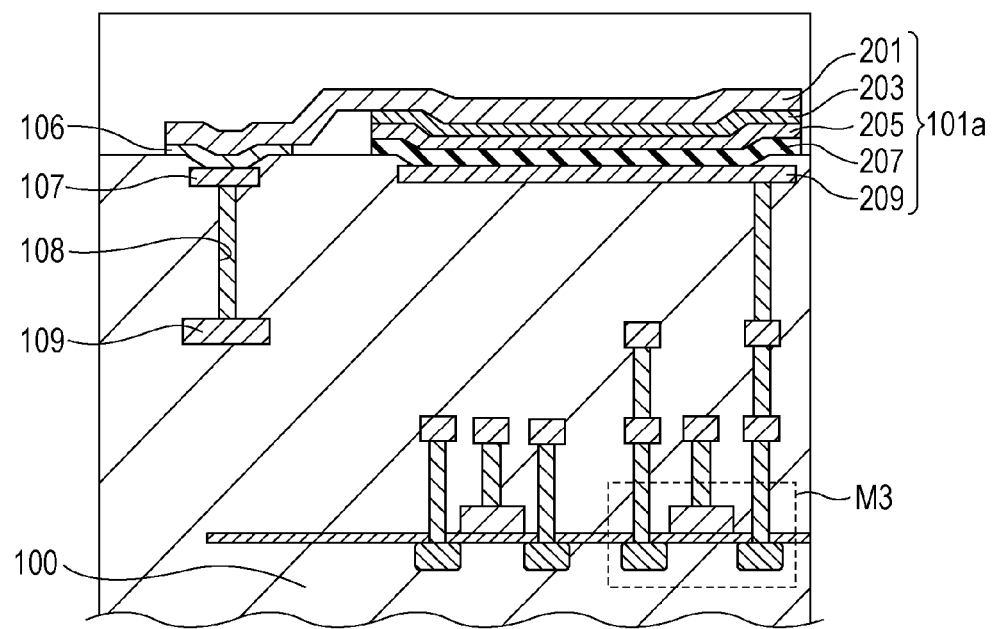
FIG. 5 is a cross-sectional view of an exemplary photoelectric converter taken along line V-V of FIG. 4.

FIG. 4 is a bird's-eye view of the photoelectric converter of the present embodiment. FIG. 5 is a schematic sectional view along line V-V of FIG. 4.

The pixels 1000 are arranged in a matrix form in the pixel unit 1.

On the periphery of the pixel unit 1, the common electrode 201 is electrically connected via a through hole (not illustrated) to a reference voltage line 109 disposed on the semiconductor substrate 100. The reference voltage line 109 is formed by metal wiring. The common electrode 201 is desirably formed to at least cover the pixel unit 1 and the reference voltage line 109. The reference voltage lines 109 may be disposed at four sides of the periphery of the pixel unit 1. In this case, each of a plurality of reference voltage lines 109 provided at each side on the periphery of the pixel unit 1 may be electrically connected to the common electrode 201 via a via plug.

The photoelectric converter includes a voltage supply terminal 2. The voltage supply terminal 2 is electrically connected to the outside of the photoelectric converter, and to the reference voltage line 109. A predetermined voltage is supplied to the voltage supply terminal 2 from the outside of the photoelectric converter. By disposing the voltage supply terminals 2 at four corners as illustrated in FIG. 4, the voltage of the common electrode 201 may be made easily uniform on a plane of the pixel unit 1.

A transistor M3 is provided in the semiconductor substrate 100. One of main nodes of the transistor M3 is electrically connected to the pixel electrode 209 via a wiring layer.

The insulating layer 207 is provided in the pixel electrode 209 on the incident surface side thereof.

The photoelectric conversion layer 205 and the blocking layer 203 are provided in this order on the insulating layer 207.

The common electrode 201 is provided in the blocking layer 203 on the incident surface side thereof.

In the peripheral region of the pixel unit 1, the reference voltage line 109 formed by metal wiring is provided. The peripheral region of the pixel unit 1 refers to a region located outside the entire periphery of a plurality of pixels 1000 included in the pixel unit 1. The reference voltage line 109 is electrically connected to the connecting electrode 107 via the through hole 108. An oxide conductive film 106 is provided between the connecting electrode 107 and the common electrode 201. The connecting electrode 107 is a second electrode which supplies, to the common electrode 201, a potential that the common electrode 201 supplies to a plurality of photoelectric conversion units 101a.

The oxide conductive film 106 may be formed, for example, by indium tin oxide (ITO) and indium zinc oxide (IZO). The oxide conductive film 106 may be a film containing indium oxide. The oxide conductive film 106 may also be a film containing ZnO. An current flowing path is comprised by the common electrode 201, the connecting electrode 107, and the oxide conductive film 106.

Next, a method for manufacturing the photoelectric converter illustrated in FIG. 5 is described.

A transistor M3 is formed in the semiconductor substrate 100. Then, the reference voltage line 109 is formed on the periphery of the pixel unit 1. The through hole 108 is formed. The connecting electrode 107 is formed. The pixel electrode 209 is formed in parallel to the formed connecting electrode 107. The connecting electrode 107 and the pixel electrode 209 may be formed at the same time.

Then, the semiconductor substrate 100 is washed to remove particles of the pixel electrode 209 and the connecting electrode 107.

The semiconductor substrate 100 is washed by two fluid washing with water. A natural oxide film is formed on a metal surface by oxygen remaining in the washing water and oxygen in clean air of a clean room.

The formed natural oxide film is removed before the next process of forming the oxide conductive film 106. The natural oxide film may be removed by plasma etching or etching using a medical fluid.

Then, the oxide conductive film 106 is formed on the connecting electrode 107.

After the oxide conductive film 106 is formed, the insulating layer 207, the photoelectric conversion layer 205, and the blocking layer 203 are formed on the pixel electrode 209. The insulating layer 207, the photoelectric conversion layer 205, and the blocking layer 203 are formed also on the oxide conductive film 106. Then, a region above the oxide conductive film 106 is patterned to remove the insulating layer 207, the photoelectric conversion layer 205, and the blocking layer 203. A resist used for the patterning is also removed.

A surface of the blocking layer 203 and a surface of the oxide conductive film 106 of the connecting electrode 107 are washed to remove particles therefrom.

The semiconductor substrate 100 is washed by two fluid washing with water. An insulating natural oxide film is formed on a metal surface during the washing. Therefore, in a configuration in which the connecting electrode 107 and the common electrode 201 are connected directly not via the oxide conductive film 106, the natural oxide film formed on the surface of the connecting electrode 107 increases electric resistance between the connecting electrode 107 and the common electrode 201. Removal of the natural oxide film is difficult because it can cause damage to the photoelectric conversion unit 101a.

In the photoelectric converter of the present embodiment, in contrast, the oxide conductive film 106 is provided on the connecting electrode 107. An insulating natural oxide film is less easily formed on the oxide conductive film 106 during this washing process as compared with the metal surface. Therefore, as compared with a configuration in which the connecting electrode 107 and the common electrode 201 are connected directly not via the oxide conductive film 106, the photoelectric converter of the present embodiment is capable of reducing a decrease in conductivity between the connecting electrode 107 and the common electrode 201 caused during the washing process.

After the washing, the common electrode 201 is formed to extend from above the blocking layer 203 of the photoelectric conversion unit 101a to above the oxide conductive film 106.

In the photoelectric converter of the present embodiment, the oxide conductive film 106 is provided between the connecting electrode 107 and the common electrode 201. With this configuration, an insulating natural oxide film is less easily formed on the surface of the connecting electrode 107. Therefore, a decrease in conductivity between the connecting electrode 107 and the common electrode 201 may be reduced.

In the present embodiment, the reference voltage lines 109 are disposed at four sides on the periphery of the pixel unit 1, and are electrically connected to the common electrode 201 via the through hole 108 in each side. However, the present disclosure is not limited to these configurations. For example, the reference voltage line 109 may be disposed at one side or at two opposite sides of the periphery of the pixel unit 1.

The metal wiring of the photoelectric converter of the present embodiment may be a multilayer wiring structure instead of a single-layer wiring structure, such as aluminum (Al). In the multilayer wiring structure, a configuration of TiN/Al/TiN using barrier metal may be employed. The barrier metal prevents diffusion of the metallic material and increases adhesiveness to a Si substrate. Metals other than Al, e.g., Cu, may be used for the metal wiring.

In the present embodiment, the potential of the common electrode 201 is defined as the predetermined potential, and the charge of the photoelectric conversion unit 101a is refreshed by changing the potential of the pixel electrode 209. Alternatively, the potential of the pixel electrode 209 is defined as a predetermined potential, and the charge of the photoelectric conversion unit 101a may be refreshed by changing the potential of the common electrode 201.

Second Embodiment

Figure 6:
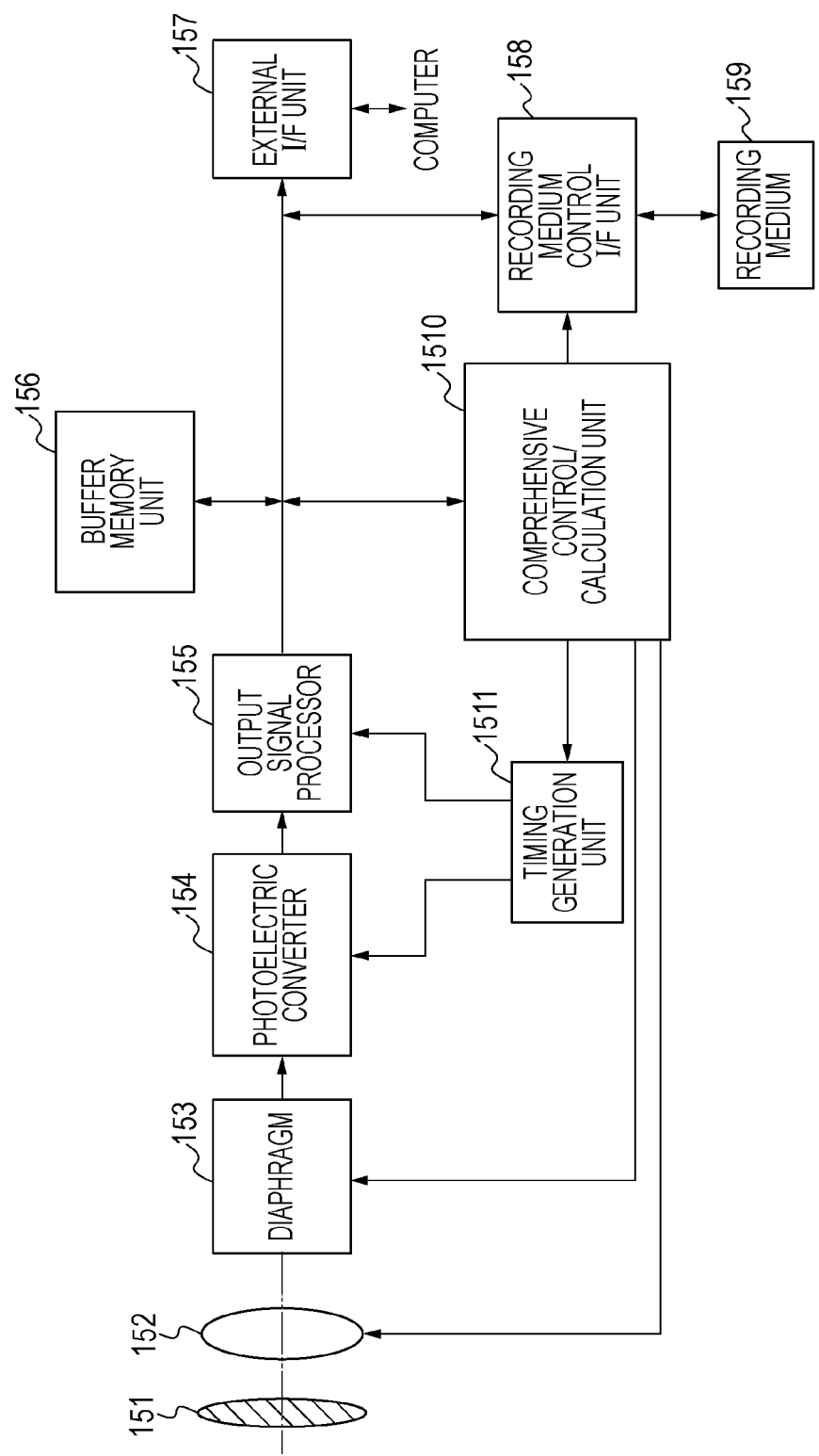
FIG. 6 illustrates an exemplary configuration of a photoelectric conversion system.

The photoelectric converter described in the above embodiment is applicable to various photoelectric conversion systems. Examples of the photoelectric conversion systems include a digital still camera, a digital camcorder, and a monitoring camera. FIG. 6 is a schematic diagram of a photoelectric conversion system in which the photoelectric converter of the first embodiment is applied to a digital still camera as an example of the photoelectric conversion system.

The photoelectric conversion system illustrated to FIG. 6 includes a photoelectric converter 154, a barrier 151 for the protection of a lens, a lens 152 that focuses an optical image of an object on the photoelectric converter 154, and a diaphragm 153 that makes light quantity passing through the lens 152 variable. The lens 152 and the diaphragm 153 are an optical system that condenses light to the photoelectric converter 154. The photoelectric conversion system illustrated in FIG. 6 further includes an output signal processor 155 that processes an output signal output from the photoelectric converter 154.

The output signal processor 155 performs AD conversion of converting analog signals output from the photoelectric converter 154 into digital signals. The output signal processor 155 outputs image data after, as necessity, performing various corrections and compressions.

The photoelectric conversion system illustrated in FIG. 6 further includes a buffer memory unit 156 that temporarily stores image data, and an external interface unit (external I/F unit) 157 for the communication with, for example, an external computer. The photoelectric conversion system further includes a recording medium 159, such as semiconductor memory, for recording or reading of picked image data, and a recording medium control interface unit (recording medium I/F unit) 158 for recording on or reading from recording medium 159. The recording medium 159 may be integrated in or may be detached from the photoelectric conversion system.

The photoelectric conversion system further includes a comprehensive control/calculation unit 1510 that controls various calculations and the entire digital still camera, and a timing generation unit 1511 that outputs various timing signals to the photoelectric converter 154 and the output signal processor 155. Here, the timing signals or other signals may be input from the outside, and it is only necessary that the photoelectric conversion system at least includes the photoelectric converter 154, and the output signal processor 155 that processes the output signal output from the photoelectric converter 154. As described above, the photoelectric conversion system of the present embodiment is capable of performing an image pickup operation with the photoelectric converter 154 applied thereto.

Note that the embodiments described above are merely examples of embodiments to implement the present invention(s), and the technical scope of the present invention(s) should not be restrictively interpreted. That is, the present invention(s) can be implemented in various forms without deviating from the technical idea or the principle features thereof.

Advantageous Effects of Invention

The present disclosure provides a photoelectric converter, and a photoelectric conversion system, capable of reducing a decrease in conductivity between the connecting electrode and the common electrode.

While the present inventions have been described with reference to exemplary embodiments, it is to be understood that the inventions are not limited to the disclosed exemplary embodiments. The scope of the following claims is to be accorded the broadest interpretation so as to encompass all such modifications and equivalent structures and functions.

This application claims the benefit of Japanese Patent Application No. 2014-183698, filed Sep. 9, 2014, which is hereby incorporated by reference herein in its entirety.

What is claimed is:

1. A photoelectric converter, comprising:
   a plurality of pixels each having a photoelectric conversion layer and a pixel electrode configured to supply a potential to the photoelectric conversion layer thereof;
   a first electrode configured to supply a potential to each of the photoelectric conversion layers of the plurality of pixels in common, and the first electrode having a region opposite to the pixel electrode via the photoelectric conversion layer of each pixel; and
   a second electrode configured to supply the potential to the first electrode, wherein
   the pixel electrode of each pixel is formed by metal, and further includes an oxide conductive film provided between the first electrode and the second electrode, and the oxide conductive film contacts the first electrode and the second electrode.

2. The photoelectric converter according to claim 1, wherein the oxide conductive film includes indium oxide.

3. The photoelectric converter according to claim 1, wherein the second electrode is disposed outside a region surrounded by a periphery of the plurality of pixels.

4. A photoelectric conversion system comprising:
   the photoelectric converter according to claim 1; and
   an output signal processor that outputs image data using signals output from the photoelectric converter.

5. A method for manufacturing a photoelectric converter which includes:
   a plurality of pixels each having a photoelectric conversion layer and a pixel electrode that is formed by metal and configured to supply a potential to the photoelectric conversion layer thereof,
   a first electrode configured to supply a potential to each of the photoelectric conversion layers of the plurality of pixels in common, and the first electrode having a region opposite to the pixel electrode via the photoelectric conversion layer of each pixel,
   a second electrode configured to supply the potential to the first electrode, and
   an oxide conductive film disposed between the first electrode and the second electrode, and configured to contact the first electrode and the second electrode, the method comprising:
   a first process of forming the second electrode;
   a second process of forming the pixel electrode of each pixel;
   a third process of forming the oxide conductive film on the second electrode so that the oxide conductive film contacts the second electrode; and
   a fourth process of forming the first electrode on the oxide conductive film so that the oxide conductive film contacts the first electrode.

6. The method for manufacturing a photoelectric converter according to claim 5, wherein the first process and the second process are performed at the same time.

7. The method for manufacturing a photoelectric converter according to claim 5, wherein the third process is performed after the first process and the second process are performed.

8. The method for manufacturing a photoelectric converter according to claim 7, wherein the first process and the second process are performed at the same time.

* * * * *